(12) United States Patent
Gilton (10) Patent No.: US 8,093,673 B2
(45) Date of Patent: Jan. 10, 2012

(54) COLUMNATED BACKSIDE ILLUMINATION STRUCTURE

(75) Inventor: Terry L. Gilton, Boise, ID (US)

(73) Assignee: Aptina Imaging Corporation, George Town (KY)

( * ) Notice: Subject to any disclaimer, the term of this patent is extended or adjusted under 35 U.S.C. 154(b) by 186 days.

(21) Appl. No.: 12/533,709

(22) Filed: Jul. 31, 2009

(65) Prior Publication Data

US 2011/0024856 A1 Feb. 3, 2011

(51) Int. Cl.
*H01L 31/0232* (2006.01)

(52) U.S. Cl. ............... 257/432; 257/E31.032; 438/70

(58) Field of Classification Search ............... 257/432, 257/E31.032; 438/70
See application file for complete search history.

(56) References Cited

U.S. PATENT DOCUMENTS

| | | | |
|---|---|---|---|
| 5,473,710 A | 12/1995 | Jaw et al. | |
| 5,844,290 A * | 12/1998 | Furumiya | 257/432 |
| 6,140,630 A | 10/2000 | Rhodes | |
| 6,204,524 B1 | 3/2001 | Rhodes | |
| 6,310,366 B1 | 10/2001 | Rhodes et al. | |
| 6,326,652 B1 | 12/2001 | Rhodes | |
| 6,798,932 B2 | 9/2004 | Kuhara et al. | |
| 6,904,209 B2 | 6/2005 | Okada et al. | |
| 7,041,956 B2 * | 5/2006 | Takahashi et al. | 250/208.1 |
| 7,357,513 B2 | 4/2008 | Watson et al. | |
| 7,400,439 B2 | 7/2008 | Holman | |
| 7,666,704 B2 * | 2/2010 | Suzuki et al. | 438/69 |
| 7,800,192 B2 * | 9/2010 | Venezia et al. | 257/432 |
| 2005/0236553 A1 * | 10/2005 | Noto et al. | 250/208.1 |
| 2006/0056166 A1 | 3/2006 | Yeo et al. | |
| 2006/0115230 A1 * | 6/2006 | Komoguchi et al. | 385/146 |
| 2006/0138577 A1 * | 6/2006 | Hashimoto | 257/432 |
| 2008/0157140 A1 * | 7/2008 | Cho | 257/292 |
| 2009/0102001 A1 * | 4/2009 | Lee | 257/432 |
| 2009/0127442 A1 * | 5/2009 | Lee | 250/227.11 |
| 2009/0160002 A1 * | 6/2009 | Yun | 257/432 |
| 2009/0189237 A1 * | 7/2009 | Hirano | 257/432 |

FOREIGN PATENT DOCUMENTS

WO WO 2006115142 A1 * 11/2006

OTHER PUBLICATIONS

Mendis et al., "CMOS Active Pixel Image Sensor," *IEEE Transactions on Electron Devices*, vol. 41, No. 3, Mar. 1994, pp. 452-453.
Nixon et al., "256 x 256 CMOS Active Pixel Sensor Camera-on-a-Chip," *IEEE Journal of Solid-State Circuits*, vol. 31, No. 12, Dec. 1996, pp. 2046-2050.

* cited by examiner

*Primary Examiner* — Steven J Fulk (57) ABSTRACT

Imager devices, systems including the imager devices and methods of forming the imager devices are provided. The imager device has a substrate with first and second opposing sides. The imager also includes an array of imager pixels at the first side of the substrate, each including a photoconversion device. An antireflective material is on the second side of the substrate and a dielectric material is over the antireflective material. A light guide material is disposed within a plurality of openings in the dielectric material and optically aligned with a respective photoconversion device.

17 Claims, 7 Drawing Sheets

COLUMNATED BACKSIDE ILLUMINATION STRUCTURE

FIELD OF THE INVENTION

The invention relates generally to solid state imaging devices and more particularly to structures including a pixel having a light guide and methods of forming the same.

BACKGROUND

There are a number of different types of semiconductor-based imagers, including charge coupled devices (CCD's), photodiode arrays, charge injection devices (CID's), hybrid focal plane arrays, and complementary metal oxide semiconductor (CMOS) imagers. Current applications of solid-state imagers include cameras, scanners, machine vision systems, vehicle navigation systems, video telephones, computer input devices, surveillance systems, auto focus systems, star trackers, motion detector systems, image stabilization systems, and other image acquisition and processing systems.

CMOS imager devices are well known. CMOS imager devices are discussed, for example, in Nixon et al., "256×256 CMOS Active Pixel Sensor Camera-on-a-Chip," IEEE Journal of Solid-State Circuits, Vol. 31(12), pp. 2046-2050 (1996); Mendis et al., "CMOS Active Pixel Imager devices," IEEE Transactions on Electron Devices, Vol. 41(3), pp. 452-453 (1994); and are also disclosed in U.S. Pat. Nos. 6,140,630, 6,204,524, 6,310,366 and 6,326,652; assigned to Aptina Imaging Corporation, the entire disclosures of which are incorporated herein by reference.

CMOS imager devices typically include an array of pixels, which converts light energy received, through an optical lens, into electrical signals. Each pixel contains a photoconversion device for converting a respective portion of a received image into an electrical signal. The electrical signals produced by the array of photoconversion devices are processed to render a digital image.

The amount of charge generated by the photoconversion device corresponds to the intensity of light impinging on the photoconversion device. Accordingly, it is important that all of the light directed to the photoconversion device impinges on the photoconversion device rather than being reflected or refracted toward another photoconversion device as optical cross-talk.

For example, optical cross-talk may exist between neighboring photoconversion devices in a pixel array. In an ideal imager, a light enters only through the surface of the photoconversion device that directly receives the light stimulus. In reality, however, some light intended for one photoconversion device also impinges on another photoconversion device through the sides of the optical path existing between a lens and photoconversion device.

Optical cross-talk can bring about undesirable results in the images produced by the imaging device. The undesirable results can become more pronounced as the density of a pixel in imager arrays increases, and as pixel size correspondingly decreases. The shrinking pixel sizes make it increasingly difficult to properly focus incoming light on the photoconversion device of each pixel without accompanying optical cross-talk.

Optical cross-talk can cause a blurring or reduction in contrast in images produced by the imaging device. Optical cross-talk also degrades the spatial resolution, reduces overall sensitivity, causes color mixing, and leads to image noise after color correction. As noted above, image degradation can become more pronounced as pixel and device sizes are reduced. Furthermore, degradation caused by optical cross-talk is more conspicuous at longer wavelengths of light. Light having longer wavelengths penetrates more deeply into the silicon structure of a pixel, providing more opportunities for the light to be reflected or refracted away from its intended photoconversion device target.

Accordingly, there is a need and desire for an improved apparatus and method for reducing optical cross-talk in imaging devices.

DETAILED DESCRIPTION

In the following detailed description, reference is made to the accompanying drawings which form a part hereof, and in which is shown by way of illustration specific embodiments by which the invention may be practiced. It should be understood that like reference numerals represent like elements throughout the drawings. These exemplary embodiments are described in sufficient detail to enable those skilled in the art to practice the invention. It is to be understood that other embodiments may be utilized, and that structural, logical and electrical changes may be made.

The terms "wafer" and "substrate" are to be understood as including all forms of semiconductor wafers and substrates including silicon, silicon-on-insulator (SOI), silicon-on-sapphire (SOS), doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on other semiconductors, for example, silicon-germanium, germanium, or gallium arsenide.

The term "pixel" refers to a picture element unit cell containing circuitry including a photoconversion device for converting electromagnetic radiation to an electrical signal. For purposes of illustration, fabrication of one or more representative pixels is shown and described. Typically, fabrication of all pixels in an imager will proceed simultaneously in a similar fashion.

An imager device including an array of pixels at a surface of a substrate is disclosed. The array includes light guides for directing light to respective photoconversion devices of the pixels of the array. The light guide is formed within a dielectric material and over an antireflective material. The imager device can be configured to receive light at a surface of the substrate opposite the pixels. The light guide, dielectric material and antireflective material can also be located a surface of the substrate opposite the pixels.

The dielectric material has a first refractive index, the antireflective material has a second refractive index and the material of the light guide has a third refractive index. The materials are selected such that the third refractive index is greater than or equal to the second refractive index, and the second refractive index is greater than the first refractive index.

Figure 1A:
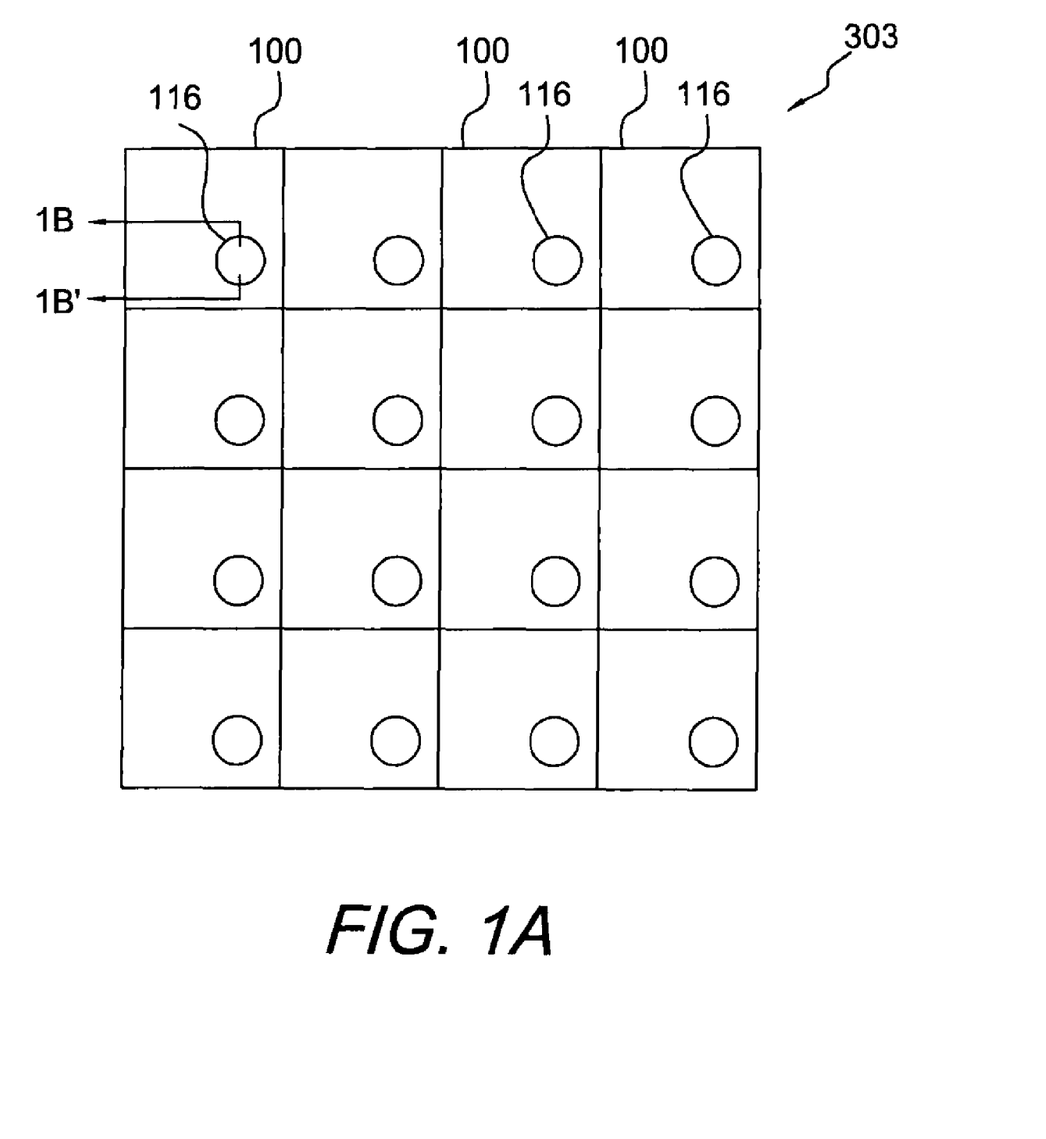
FIG. 1A is a block diagram of a portion of a pixel array according to an embodiment of the invention.
Figure 3:
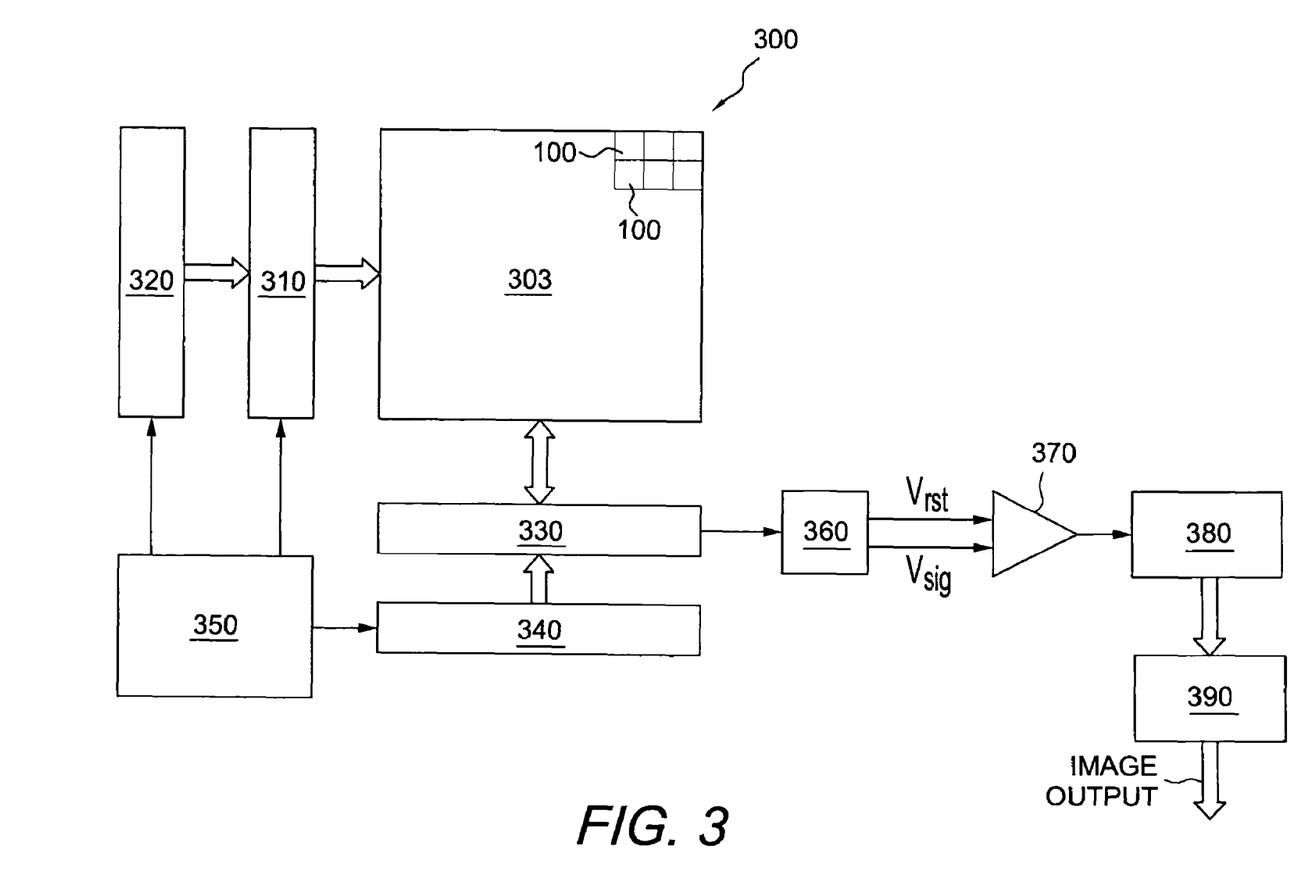
FIG. 3 is a block diagram of an imager device including the pixel of FIG. 1A.

FIG. 1A illustrates a portion of a pixel array 303 of an imager device 300 (FIG. 3). The pixel array 303 includes pixels 100. The array also includes a light guide 116 for each pixel 100. Each light guide 116 serves to direct light to the photoconversion device 125 (FIG. 1B) of a respective pixel 100 to reduce optical cross-talk between pixels 100 of the array 303.

Figure 1B:
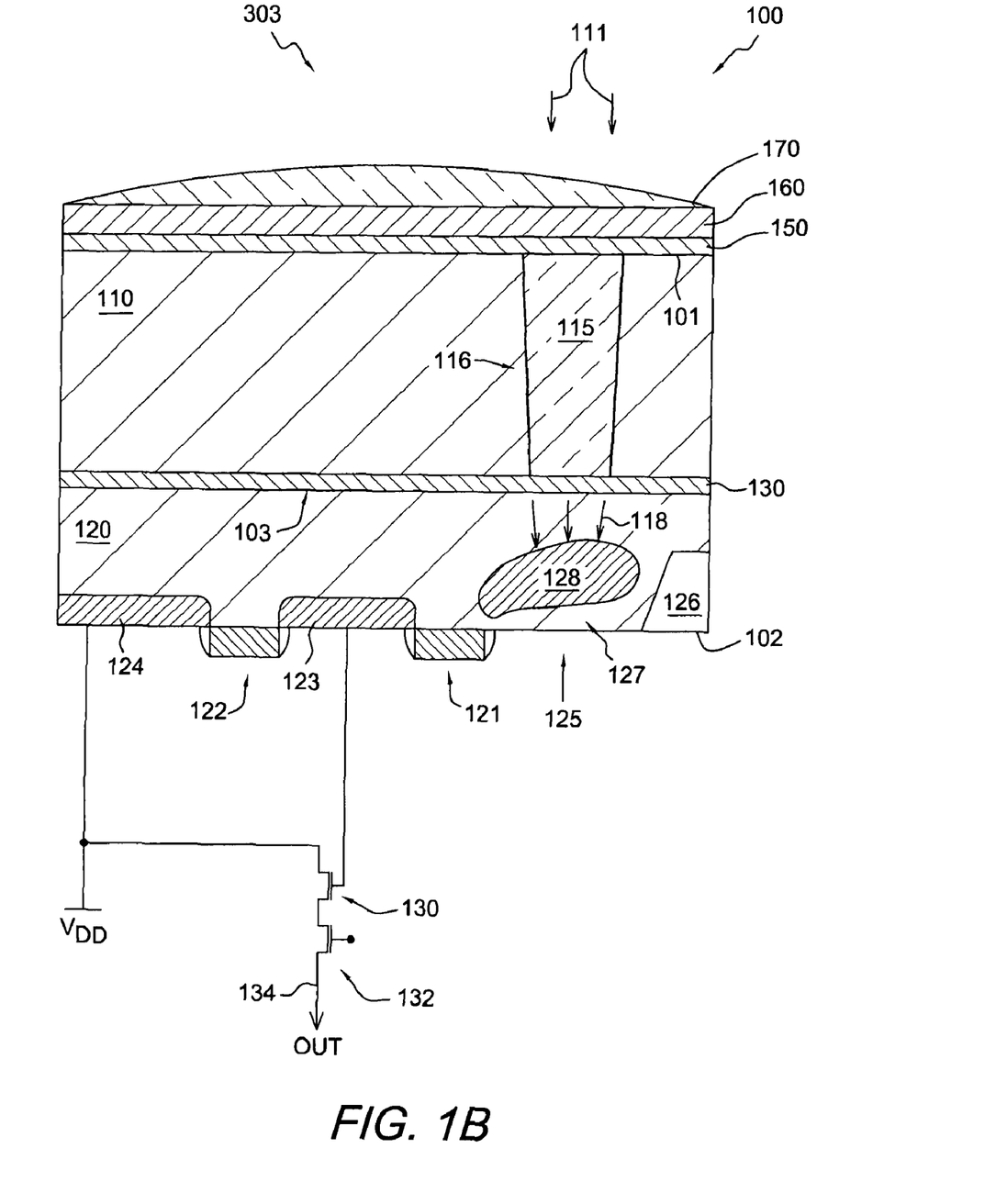
FIG. 1B is a cross sectional view of a portion of a pixel of FIG. 1A along the line 1B-1B'.

FIG. 1B is a cross sectional view of a portion of a pixel 100 along the line 1B-1B'. Pixel 100 includes a substrate 120, which is, for example a p-type silicon substrate. Substrate 120 could instead be any other suitable semiconductor material and could be of a different conductivity type.

A photoconversion device 125 is located at a front side surface 102 of the substrate 120. In the illustrated example, the photoconversion device is a pinned photodiode having a heavily doped p-type region 127 and an n-type region 128. The photoconversion device could instead be any other type of photoconversion device, such as a diode or a photogate, among others.

An isolation region 126 for isolating structures of the array 303 and pixel 100 is adjacent the photoconversion device 125. The isolation region is, for example a shallow trench isolation region, but could be any other suitable type of isolation region.

A transfer transistor 121 is electrically connected to the photoconversion device 125, such that region 128 serves as a first source/drain region of the transfer transistor 121. The transfer transistor serves to transfer charge from the photoconversion device 125 to a floating diffusion region 123, which serves as a second source/drain region of the transfer transistor 121. The floating diffusion region 123 is an n-type region at a surface of substrate 120.

The pixel 100 also includes a reset transistor 122 connected to the floating diffusion region 123. The reset transistor serves to reset the floating diffusion region and photoconversion device 125 to a predetermined voltage, $V_{rst}$ (FIG. 3). The floating diffusion region 123 serves as one source/drain region of the reset transistor 122 and the n-type region 124 serves as a second source/drain region for the reset transistor 122. Region 124 can be connected to a voltage source $V_{DD}$ whose voltage is used to reset the floating diffusion region 123.

While the pixel 100 is depicted as including a transfer transistor 121 and reset transistor 123, the pixel 100 can include other transistors and have a different configuration. For example, for a four transistor CMOS pixel, a source follower transistor 130 can have its gate connected to floating diffusion region 123 and supply an output signal through a row select transistor 132 to a pixel array column line 134 as shown in FIG. 1B and as known in the art.

An antireflective material 130 having a refractive index of $n_2$ is formed on the back side or second surface 103 of the substrate 120. A dielectric material 110 having a refractive index of $n_1$ is formed in contact with the antireflective material 110. Each of the antireflective material 130 and dielectric material 110 are shown as blanket layers on the back side surface 103 the substrate 120.

A light guide 116 is within the dielectric material 110 and positioned in optical alignment with the photoconversion device 125. The light guide 116 includes a light guide material 115 having a refractive index of $n_3$. In the example shown in FIG. 1B, the light guide 115 extends from a top or first surface of the dielectric material 110 to the antireflective material 130 and is in contact with the antireflective material 130.

The dielectric material 110, antireflective material 130 and material 115 are selected such that the following is true: $n_3 \geq n_2$ and $n_2 > n_1$. In one example, $n_2 = n_3$.

As pixel 100 is configured to be illuminated from the backside 101 (as depicted by arrows 111), the light is incident on the surface 101 of the dielectric material. Due to the differences in the refractive indices $n_1$, $n_2$, $n_3$ of the dielectric material 110, antireflective material 130 and material 115, light is columnated and directed to the photoconversion device 125, as depicted by arrows 118. In this manner, optical cross-talk is reduced between pixels 100 within an array 303.

Optionally, the array 303 also includes a sealing material 150 on the dielectric material 110 and material 115 of the light guide 116. The sealing material 150 can be, for example, a resin and formed as a blanket layer over the array 303. Other passivation and/or sealing materials can be used.

A color filter array 160 is over the sealant material 150. Each color filter of the color filter array 160 is aligned with a respective photoconversion device 125 of each pixel 100. An array of microlenses 170 is formed over the color filter array 170. Each microlens of the microlens array 170 is optically aligned with a respective photoconversion device 125 of each pixel 100.

FIGS. 2A-2E depict process steps for forming the array 303, including pixel 100. No particular order is required for any of the actions described herein, except for those logically requiring the results of prior actions. Accordingly, while the actions below are described as being performed in a general order, the order is exemplary only and can be altered. For clarity, the formation of the array 303 is described primarily in connection with a single pixel 100, but other pixels 100 can be formed at the same time in the same manner.

Figure 2A:
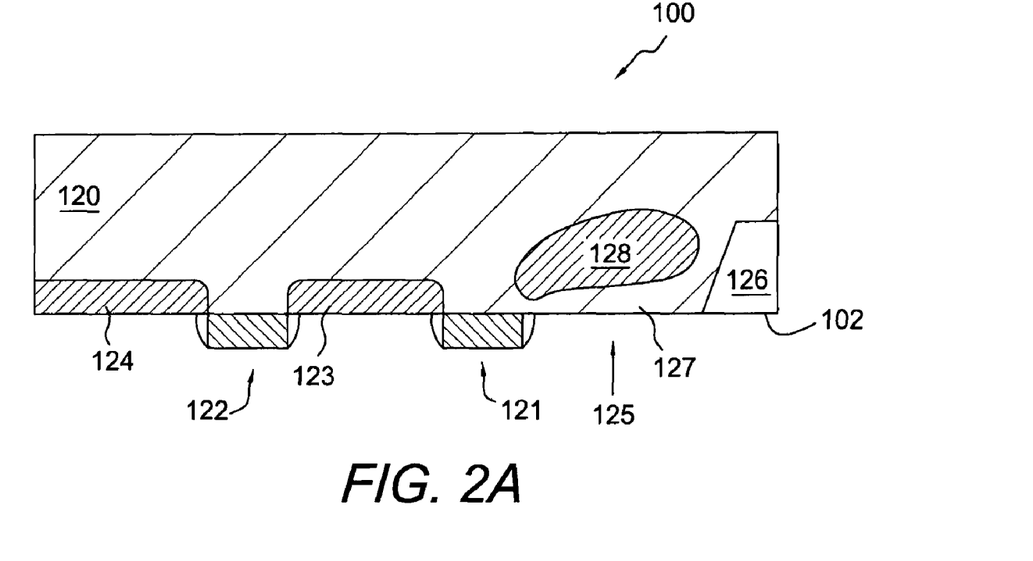
FIGS. 2A-2E illustrate intermediate stages of fabrication of the pixel of FIG. 1A.

As shown in FIG. 2A, substrate 120, e.g., a silicon substrate, is fabricated to include on a front side surface 102 the various electrical structures of pixel 100 (including the photoconversion device 125, transistors 121, 122 and doped regions 124, 123 and other pixel structures) according to known methods.

Figure 2B:
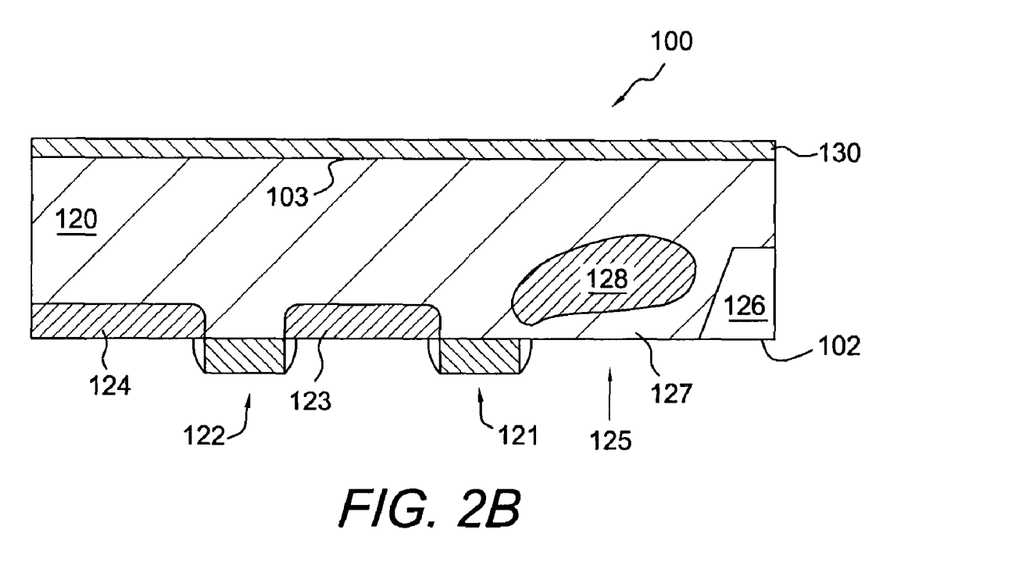

FIG. 2B depicts the formation of the antireflective material 130 as a blanket layer on a backside second surface 103 of the substrate 120. The antireflective material 130 can be any suitable material. The antireflective material is selected to have a refractive index $n_2$ having the above described relationship to the refractive indices $n_1$, $n_2$ of the dielectric material 110 and material 115. The antireflective material 130 can include, for example, a resin, organic polymers, or materials comprising silicon and nitrogen; silicon and oxygen; or silicon, oxygen and nitrogen.

Figure 2C:
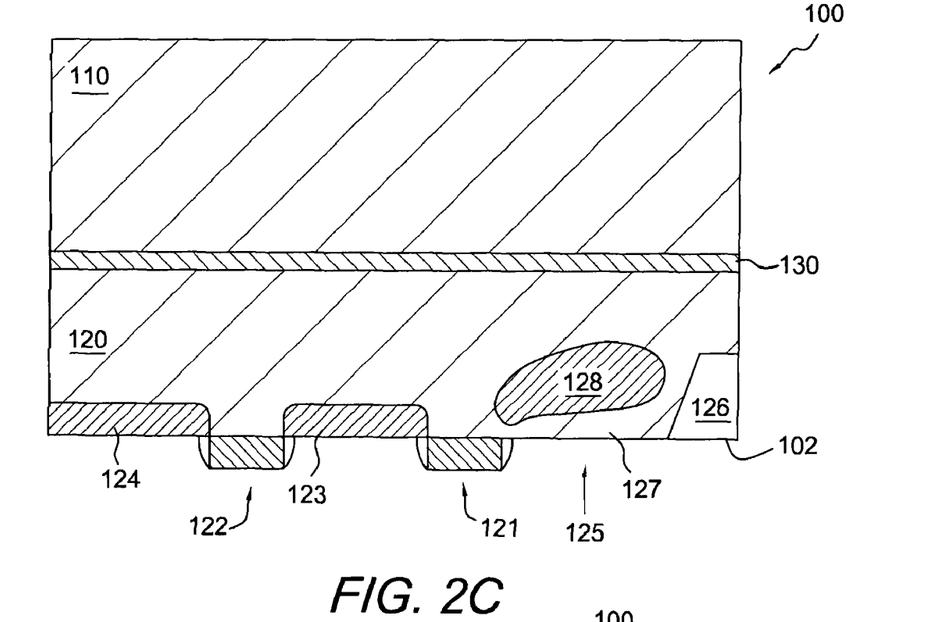

As shown in FIG. 2C, a dielectric layer 110 is formed over the antireflective material 130. The dielectric material 110 can be any suitable material having a refractive index $n_1$ having the above described relationship to the refractive indices $n_3$, $n_2$ of the antireflective material 130 and material 115. In one example, the dielectric material is silicon dioxide ($SiO_2$).

Figure 2D:
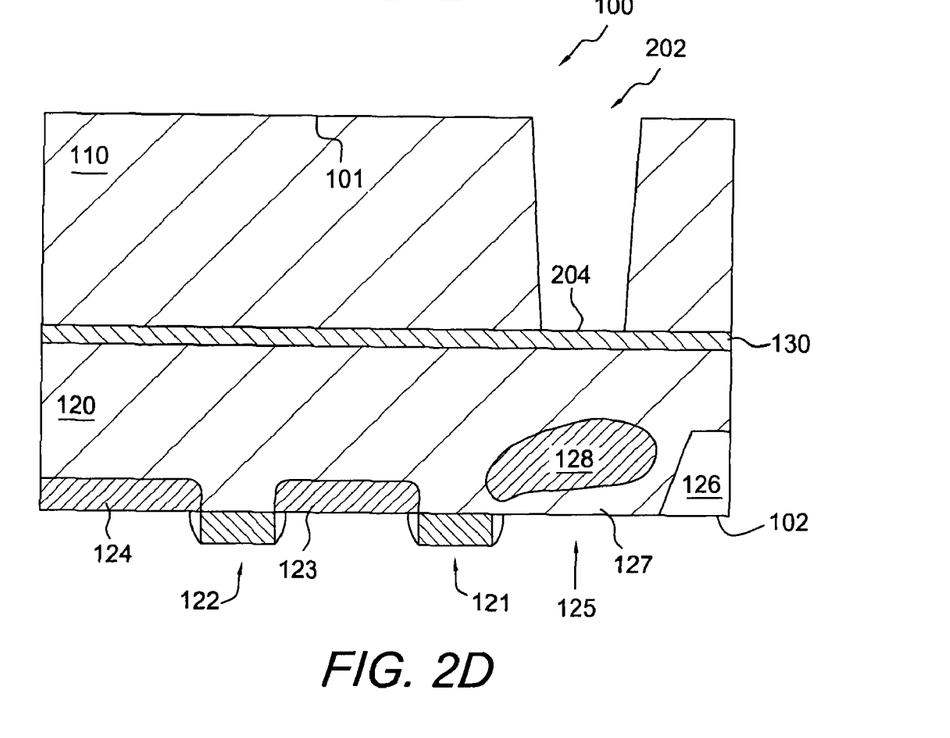

Referring to FIG. 2D, an opening 202 is formed in the dielectric material 110 by any known technique. In the illustrated example, the opening 202 extends from a surface 101 of the dielectric material to the antireflective material 130 and exposes a surface 204 of the antireflective material 130.

Figure 2E:
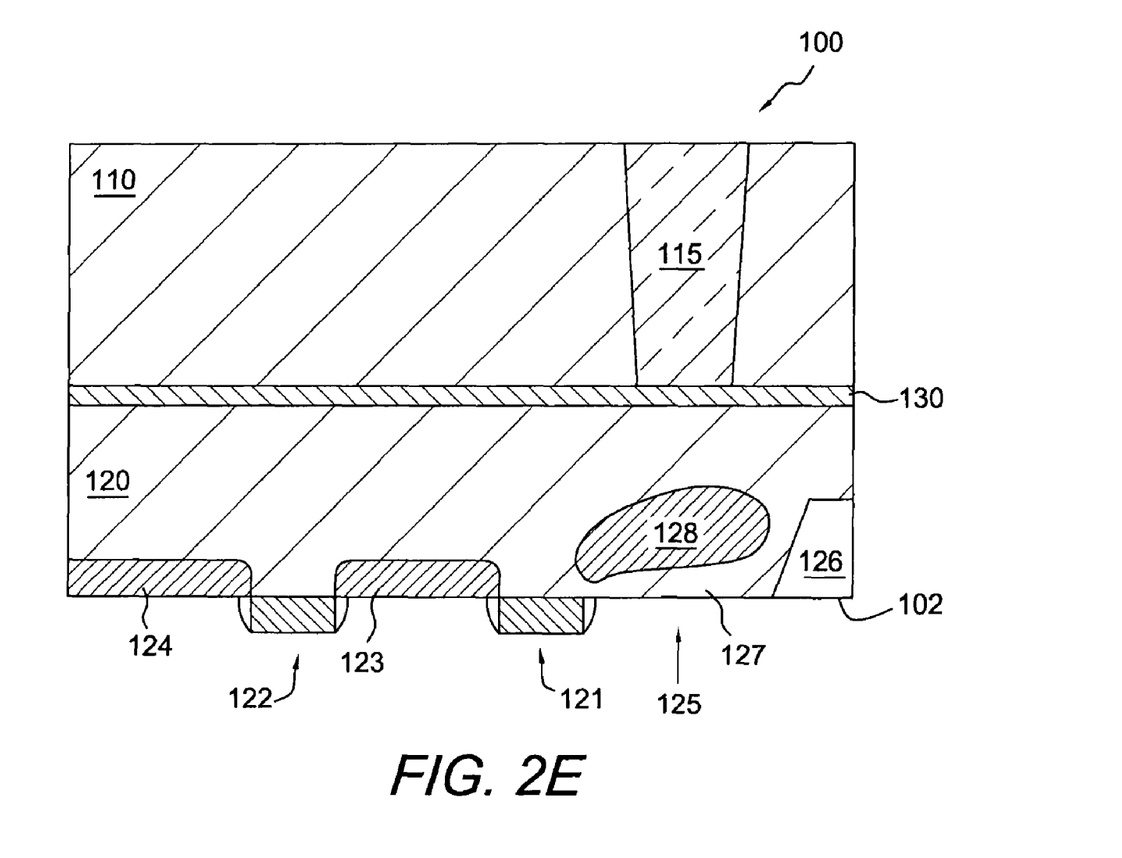

Material 115 is deposited within the opening 202 as shown in FIG. 2E. In the illustrated example, the material 115 is deposited to fill the opening 202. The dielectric material 110 can be any suitable material having a refractive index $n_3$ having the above described relationship to the refractive indices $n_1$, $n_2$ of the dielectric material 110 and antireflective material 130. The material 115 can include, for example, silicon and nitrogen; silicon and oxygen; or silicon, oxygen and nitrogen; and organic polymers. In one example, the antireflective material 130 and material 115 have a same refractive index, and in another example are the same material.

Once the material 115 is deposited within the opening 202, a chemical mechanical polish process is conducted to planarize the surface of the dielectric material and material 115, such that the material 115 is only within opening 202 as depicted in FIG. 2E.

The sealing material 150, color filter array 160 and microlenses 170 are formed by known methods over the dielectric material to achieve the structure shown in FIG. 1B.

Although the above example is described with reference to a pixel 100 for a CMOS imager, the example has applicability to other solid-state imaging devices using pixels (e.g., a CCD or other solid state imager).

A CMOS imager device 300 is illustrated by the block diagram of FIG. 3. The imager device 300 includes a pixel array 303, which includes pixels constructed in accordance with the embodiments described herein, e.g., pixels 100 (FIG. 1A). In the FIG. 3 example, the pixels 100 are arranged in a predetermined number of columns and rows, but could instead have any other arrangement.

The rows of pixels 100 in array 303 are read out one by one. Accordingly, pixels in a row of array 303 are all selected for readout at the same time by a row select line, and each pixel in a selected row provides a signal representative of received light to a readout line for its column. In the array 303, each column also has a select line, and the pixels 100 of each column are selectively read out in response to the column select lines.

The row lines in the array 303 are selectively activated by a row driver 310 in response to row address decoder 320. The column select lines are selectively activated by a column driver 330 in response to column address decoder 340. The array 303 is operated by the timing and control circuit 350, which controls address decoders 320, 340 for selecting the appropriate row and column lines for pixel signal readout.

The signals on the column readout lines typically include a pixel reset signal ($V_{rst}$) and a pixel image signal ($V_{sig}$) for each pixel. Both signals are read into a sample and hold circuit (S/H) 360 in response to the column driver 330. A differential signal ($V_{rst}-V_{sig}$) is produced by differential amplifier (AMP) 370 for each pixel, and each pixel's differential signal is amplified and digitized by analog-to-digital converter (ADC) 380. The analog-to-digital converter 380 supplies the digitized pixel signals to an image processor 390, which performs appropriate image processing before providing digital signals defining an image output.

Figure 4:
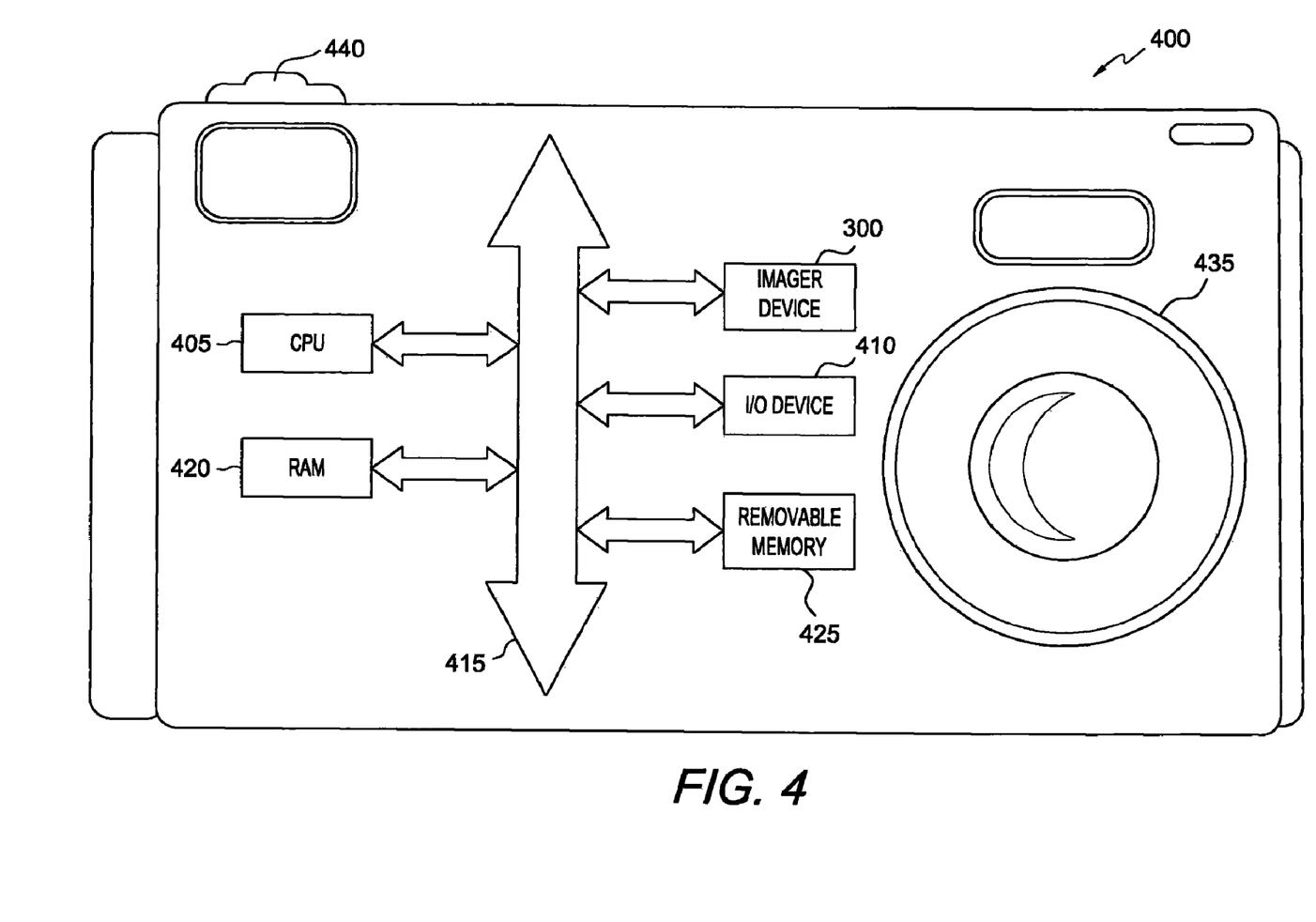
FIG. 4 is a block diagram of a processor system including the imager device of FIG. 3.

FIG. 4 illustrates a processor system as part of a digital still or video camera system 400. The processing system includes a processor 405 (shown as a CPU) which implements system, e.g., camera 400, functions and also controls image flow and image processing. The processor 405 is coupled with other elements of the system, including random access memory 420, removable memory 425 such as a flash or disc memory, one or more input/output devices 410 for entering data or displaying data and/or images and imager 300 through bus 415 which may be one or more busses or bridges linking the processor system components. A lens 435 allows an image or images of an object being viewed to pass to the pixel array 303 of imager 300 when a "shutter release"/"record" button 440 is depressed.

The camera system 400 is only one example of a processing system having digital circuits that could include imager device devices. Without being limiting, such a system could also include a computer system, cell phone system, scanner, machine vision system, vehicle navigation system, video phone, surveillance system, auto focus system, star tracker system, motion detection system, image stabilization system, and other image processing systems.

While disclosed embodiments have been described in detail, it should be readily understood that the invention is not limited to the disclosed embodiments. Rather the disclosed embodiments can be modified to incorporate any number of variations, alterations, substitutions or equivalent arrangements not heretofore described.

What is claimed as new and desired to be protected by Letters Patent of the United States is:

1. An imager device comprising:
   a substrate having first and second opposing sides, wherein the substrate comprises doped regions;
   an array of imaging pixels at the first side of the substrate, each pixel comprising a photoconversion device;
   an antireflective material on the second side of the substrate;
   a dielectric material adjacent the antireflective material at the second side of the substrate; and
   a light guide material within respective openings in the dielectric material, the light guide material being optically aligned with the photoconversion devices.

2. The imager device of claim 1, wherein the dielectric material has a first refractive index, the antireflective material has a second refractive index and the light guide material has a third refractive index, and wherein third refractive index is greater than or equal to the second refractive index and the second refractive index is greater than the first refractive index.

3. The imager device of claim 2, wherein the second and third refractive indices are a same refractive index.

4. The imager device of claim 1, wherein the dielectric material comprises silicon dioxide.

5. The imager device of claim 1, wherein the light guide material is in contact with a surface of the antireflective material.

6. The imager device of claim 5, wherein the light guide material is planar with a surface of the dielectric material opposing the antireflective material.

7. The imager device of claim 1, further comprising a sealing material over the dielectric material and on the second side of the substrate.

8. The imager device of claim 1, further comprising a color filter array on the second side of the substrate, each color filter of the array being aligned with a respective photoconversion device.

9. The imager device of claim 1, further comprising a plurality of microlenses on the second side of the substrate, each microlens of the array being optically aligned with a respective photoconversion device.

10. The imager device of claim 1, wherein the antireflective material is in contact with the second side of the substrate, and wherein the dielectric material is in contact with the antireflective material.

11. The imager device of claim 1, wherein the imager device is part of a system comprising a processor coupled to the imager device.

12. An imager device comprising:
   a substrate having first and second opposing sides, wherein the substrate comprises doped regions;

a pixel array, the pixel array comprising a plurality of pixels, each pixel comprising a photoconversion device formed from at least one of the doped regions;

an antireflective material having a first refractive index in contact with the second side of the substrate;

a dielectric material having a second refractive index in contact with the antireflective material and on the second side of the substrate;

a plurality of light guides, each light guide comprising a light guide material having a third refractive index within an opening in the dielectric material and in contact with the antireflective material, each light guide being optically aligned with a respective photoconversion device of each pixel, third refractive index being greater than or equal to the first refractive index and the first refractive index is greater than the second refractive index.

13. The imager device of claim 12, further comprising a sealing material in contact with the dielectric material.

14. The imager device of claim 13, further comprising a color filter array in contact with the sealing material and a plurality of microlenses in contact with the color filter array.

15. The imager device of claim 12, wherein the dielectric material is a blanket layer.

16. The imager device of claim 12, wherein the antireflective material is a blanket layer.

17. The imager device of claim 12, wherein the antireflective material and light guide material are a same material.

* * * * *